United States Patent
menon et al.

(10) Patent No.: US 12,426,218 B2
(45) Date of Patent: Sep. 23, 2025

(54) ELECTRONIC CONTROL MODULE COOLING SYSTEM

(71) Applicant: FORD GLOBAL TECHNOLOGIES, LLC, Dearborn, MI (US)

(72) Inventors: Rajagopal menon, Sunnyvale, CA (US); Matthew Swanson, Sunnyvale, CA (US); Kevin Patrick Kiliman, West Bloomfield, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 324 days.

(21) Appl. No.: 17/977,709

(22) Filed: Oct. 31, 2022

(65) Prior Publication Data

US 2024/0147675 A1 May 2, 2024

(51) Int. Cl.
H05K 7/20 (2006.01)
B60W 30/09 (2012.01)
H05K 1/02 (2006.01)

(52) U.S. Cl.
CPC ....... *H05K 7/20863* (2013.01); *H05K 1/0203* (2013.01); *H05K 7/20172* (2013.01); *H05K 7/20209* (2013.01); *H05K 7/20281* (2013.01); *B60W 30/09* (2013.01); *B60W 2420/40* (2013.01); *B60W 2420/408* (2024.01); *B60W 2710/18* (2013.01); *B60W 2710/20* (2013.01)

(58) Field of Classification Search
CPC ........... H05K 7/20281; H05K 7/20209; H05K 7/20836; H05K 7/20863; H05K 7/20172; H05K 7/20136; H05K 7/20145; H05K 7/20154; H05K 1/0212; B60W 30/09; B60W 2420/40
See application file for complete search history.

(56) References Cited

U.S. PATENT DOCUMENTS

| | | | | |
|---|---|---|---|---|
| 7,403,384 B2 * | 7/2008 | Pflueger | ............. | H05K 7/20545 361/679.48 |
| 7,414,846 B2 * | 8/2008 | Cheng | ....................... | G06F 1/20 361/679.48 |
| 7,468,885 B2 * | 12/2008 | Cheng | ................... | H01L 23/467 361/720 |

(Continued)

FOREIGN PATENT DOCUMENTS

CN  111572745 A * 8/2020

OTHER PUBLICATIONS

CN-111572745-A Translation (Year: 2019).*

Primary Examiner — Jayprakash N Gandhi
Assistant Examiner — Matthew Sinclair Muir
(74) Attorney, Agent, or Firm — Frank A. Mackenzie; Brooks Kushman P.C.

(57) ABSTRACT

Disclosed herein are system and method embodiments for a cooling system. For example, the cooling system includes a chassis that defines a cavity. A circuit board assembly is disposed in the cavity and comprises electronics that generate heat during operation. A heat sink is coupled to the electronics and is configured to engage an inner surface of the chassis. A fan is configured to direct air across the heat sink. An external cooling subsystem is mounted to at least one external surface of the chassis. The external cooling subsystem is in thermal communication with the circuit board assembly through the heat sink for transferring heat generated by the electronics.

14 Claims, 5 Drawing Sheets

(56) References Cited

U.S. PATENT DOCUMENTS

| | | | | |
|---|---|---|---|---|
| 7,591,302 B1* | 9/2009 | Lenehan | ............... | H01L 23/473 |
| | | | | 165/104.33 |
| 8,157,001 B2* | 4/2012 | Hom | ................... | H05K 7/20281 |
| | | | | 165/300 |
| 10,481,652 B2 | 11/2019 | Rice et al. | | |
| 10,645,847 B2* | 5/2020 | Edwards | ............ | H05K 7/20809 |
| 11,259,447 B2 | 2/2022 | Gao | | |
| 11,324,143 B2 | 5/2022 | Stefanoski et al. | | |
| 2005/0128710 A1* | 6/2005 | Beitelmal | .......... | H05K 7/20445 |
| | | | | 361/709 |
| 2014/0069626 A1* | 3/2014 | Lin | ........................... | G06F 1/20 |
| | | | | 165/287 |
| 2020/0196490 A1* | 6/2020 | Guillot | ............... | H05K 7/20272 |
| 2021/0349507 A1 | 11/2021 | Cao et al. | | |
| 2022/0271360 A1* | 8/2022 | Shao | ..................... | H01M 10/48 |
| 2023/0204376 A1* | 6/2023 | Fowe | ................. | G01C 21/3844 |
| | | | | 701/119 |
| 2023/0403831 A1* | 12/2023 | Mao | .................. | H05K 7/20727 |

* cited by examiner

ELECTRONIC CONTROL MODULE COOLING SYSTEM

TECHNICAL FIELD

One or more embodiments relate to cooling system for an electronic control module that includes multiple cooling stages.

BACKGROUND

A vehicle system may monitor an environment external to a vehicle for obstacle detection and avoidance. The vehicle system may include multiple sensor assemblies for monitoring objects proximate to the vehicle in the near-field and distant objects in the far-field. Each sensor assembly may include one or more sensors, such as a camera, a radio detection and ranging (radar) sensor, a light detection and ranging (lidar) sensor, and a microphone. A lidar sensor includes one or more emitters for transmitting light pulses away from the vehicle, and one or more detectors for receiving and analyzing reflected light pulses. The vehicle system may determine the location of objects in the external environment based on data from the sensors, and control one or more systems, e.g., a powertrain, braking systems, and steering systems based on the locations of the objects.

The vehicle system includes one or more electronic control modules to control the sensors and process the data collected from the sensors. These electronic control modules include electronics that generate heat during operation. Accordingly, the vehicle may include a cooling system to regulate the temperature of the electronic control module.

SUMMARY

In one embodiment, a cooling system is provided with a chassis that defines a cavity. A circuit board assembly is disposed in the cavity and comprises electronics that generate heat during operation. A heat sink is coupled to the electronics and is configured to engage an inner surface of the chassis. A fan is configured to direct air across the heat sink. An external cooling subsystem is mounted to at least one external surface of the chassis. The external cooling subsystem is in thermal communication with the circuit board assembly through the heat sink for transferring heat generated by the electronics.

In another embodiment, a vehicle system is provided with an optical sensor that is configured to monitor an environment external to a vehicle, and a chassis that defines a cavity. A circuit board assembly is disposed in the cavity and comprises electronics in communication with the optical sensor that generate heat during operation. A fan is mounted within the cavity and configured to direct air through the chassis. An external cooling subsystem is mounted to at least one external surface of the chassis, wherein the external cooling subsystem is in thermal communication with the circuit board assembly. A processor is configured to activate at least one of the fan, and the external cooling subsystem, to cool the electronics.

In yet another embodiment, a computer implemented method for controlling a cooling system is provided. A circuit board assembly is disposed within a chassis and includes electronics that communicate with an optical sensor thereby generating heat. A fan is activated to direct air through the chassis to transfer the heat from the circuit board assembly. An external cooling subsystem mounted to an external surface of the chassis is activated to transfer the heat from the circuit board assembly.

DETAILED DESCRIPTION

As required, detailed embodiments are disclosed herein; however, it is to be understood that the disclosed embodiments are merely exemplary and may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present disclosure.

Vehicle systems include electronic control modules (ECMs) that generate heat during operation. Accordingly, the vehicle may include a cooling system to regulate the temperature of these ECMs. The cooling system may include one or more heat sinks to transfer heat from the electronics to a fluid medium, such as air or liquid. The cooling system may also include one or more mechanisms to control the flow of the fluid in the fluid medium. For example, the cooling system may include a fan to control air flow through an air medium. The cooling system may also include pumps and valves to control liquid flow through a liquid medium.

The mounting location of the ECM may affect its ambient temperature and the type of cooling system available. For example, an ECM mounted within a passenger cabin may experience lower ambient temperatures than an ECM mounted under the hood, in the trunk, or within a floor compartment. A liquid cooling system may utilize existing vehicle cooling system components, such as a radiator, a reservoir, and pumps, which may limit the location for a liquid cooled ECM. Additionally, an ECM with an air cooling system may be unsealed and include vents for circulating air through the ECM. However, an ECM mounted in certain vehicle locations may be susceptible to water ingress. For example, a user may spill a drink, or spray water inside a passenger compartment for cleaning near an ECM, resulting in water ingress. Additionally, such vents could be inadvertently blocked by other objects in the region, such as luggage.

A liquid cooling system may provide better heat transfer performance than an air cooling system, and therefore may be used for high temperature applications. However, the cost of an ECM is also a function of its volume. Therefore the cost of an ECM with an air cooling system may be controlled by maximizing common components with an ECM having a liquid cooling system. However, an air cooling system and a liquid cooling system typically include different components. For example, a liquid cooling system is typically designed to be sealed to isolate the electronics from the liquid.

According to some aspects of the disclosure, the cooling system provides solutions to maximize efficiency by including a modular cooling system that includes two cooling subsystems that collectively provide three different cooling stages: 1) internal cooling, 2) external cooling, and 3) combined internal and external cooling. The cooling system may include both the internal cooling subsystem and the external cooling subsystem to provide all three cooling stages for high temperature applications. The cooling system may include just the internal cooling subsystem for low temperature applications. Both applications would use many of the same internal cooling subsystem components resulting in reduced costs due to economies of scale. The cooling system, when implemented in a high temperature application, allows for control of one or both cooling subsystems based on temperature to maximize heat transfer performance, while maximizing efficiency and reducing noise by deactivating a stage when it is not needed.

Figure 1:
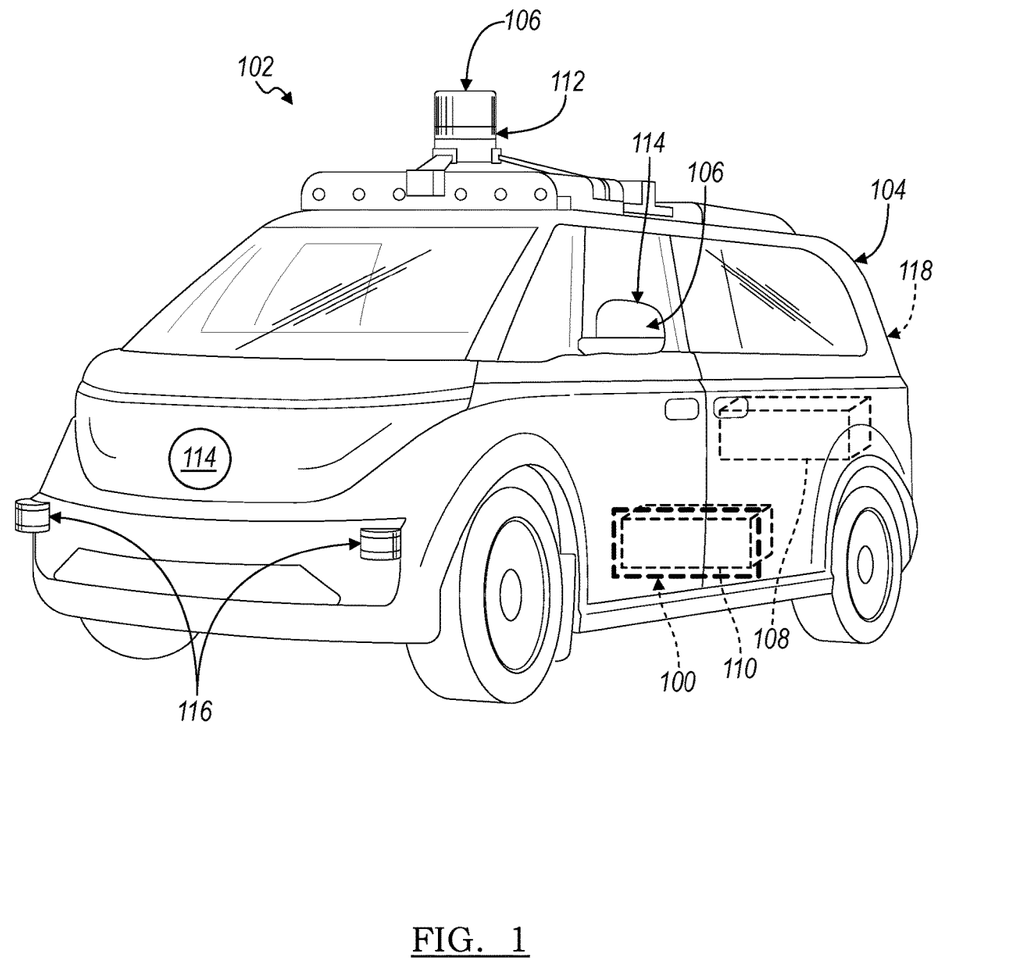
FIG. 1 is a front-perspective view of an exemplary vehicle with a cooling system for a self-driving system (SDS), in accordance with aspects of the disclosure.

With reference to FIG. 1, a cooling system is illustrated in accordance with aspects of the disclosure and generally referenced by numeral 100. The cooling system 100 is integrated with a vehicle system, such as a self-driving system (SDS) 102 of a vehicle 104, such as a self-driving vehicle. The SDS 102 includes a plurality of optical sensors 106 that monitor a field-of-view (FoV) about the vehicle 104. The SDS 102 also includes multiple ECMs, such as an autonomous vehicle subsystem (AVS) 108 and a complimentary autonomous vehicle subsystem (CAVS) 110. The cooling system 100 is integrated with the CAVS 110 and includes two cooling subsystems to provide three cooling stages: 1) internal cooling, 2) external cooling, and 3) combined internal and external cooling.

The SDS 102 includes multiple sensor assemblies to collectively monitor a 360-degree FoV around the vehicle 104 in the near-field and the far-field. The SDS 102 includes a top sensor assembly 112, two side sensor assemblies 114, two front sensor assemblies 116, and a rear-sensor assembly 118, according to aspects of the disclosure. Each sensor assembly includes one or more optical sensors 106, such as a camera, a lidar sensor, and a radar sensor.

The top sensor assembly 112 is mounted to a roof of the vehicle 104 and includes multiple optical sensors 106, such as one or more lidar sensors and cameras. The lidar sensor rotates about an axis to scan a 360-degree FoV about the vehicle 104. The side sensor assemblies 114 are mounted to a side of the vehicle 104, for example, to a front fender, or within a side-view mirror as shown in FIG. 1. Each side sensor assembly 114 includes multiple optical sensors 106, such as, a lidar sensor and a camera to monitor a FoV adjacent to the vehicle 104 in the near-field. The front sensor assemblies 116 are mounted to a front of the vehicle 104, such as, adjacent to the headlights. Each front sensor assembly 116 includes multiple optical sensors 106, for example, a lidar sensor, a radar sensor, and a camera to monitor a FoV in front of the vehicle 104 in the far-field. The rear-sensor assembly 118 is mounted to an upper rear portion of the vehicle 104, such as adjacent to a Center High Mount Stop Lamp (CHMSL). The rear-sensor assembly 118 also includes multiple optical sensors 106, such as a camera and a lidar sensor for monitoring the FoV behind the vehicle 104.

Figure 2:
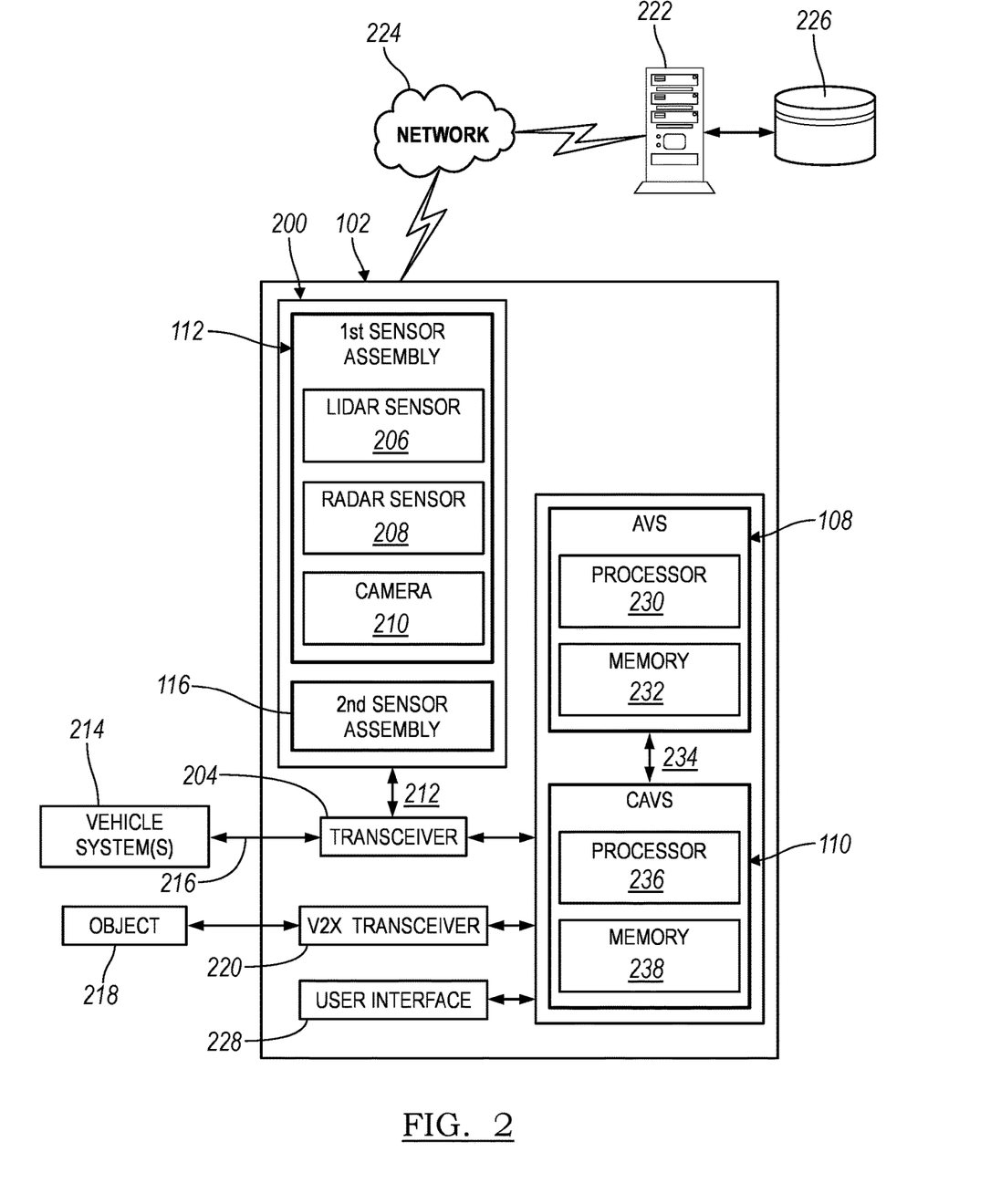
FIG. 2 is a schematic diagram illustrating an exemplary architecture of the SDS of FIG. 1, in accordance with aspects of the disclosure.

FIG. 2 illustrates communication between the SDS 102 and other systems and devices, according to aspects of the disclosure. The SDS 102 includes a sensor system 200 and redundant subsystems, including the AVS 108 and the CAVS 110 that each perform the same, or substantially the same functionality. The AVS 108 and the CAVS 110 may be mounted in different vehicle locations to provide a back-up in the event one of the ECMs is damaged. For example, the AVS 108 may be mounted within a trunk and the CAVS 110 may be mounted within a floor compartment of the vehicle 104, as illustrated in FIG. 1. The AVS 108 may communicate with other systems and devices by wired or wireless communication through a transceiver 204.

The sensor system 200 includes the sensor assemblies, such as the top sensor assembly 112 and the front sensor assembly 116. The top sensor assembly 112 includes one or more sensors, e.g., a lidar sensor 206, a radar sensor 208, and a camera 210. The camera 210 may be a visible spectrum camera, an infrared camera, etc., according to aspects of the disclosure. The sensor system 200 may include additional sensors, such as a microphone, a sound navigation and ranging (SONAR) sensor, temperature sensors, position sensors (e.g., global positioning system (GPS), etc.), location sensors, fuel sensors, motion sensors (e.g., inertial measurement units (IMU), etc.), humidity sensors, occupancy sensors, or the like. The sensor system 200 provides sensor data 212 that is indicative of the external environment of the vehicle 104. The AVS 108 and the CAVS 110 analyze the sensor data to identify and determine the location of external objects relative to the vehicle 104, e.g., the location of traffic lights, remote vehicles, pedestrians, etc.

The SDS 102 also communicates with one or more vehicle systems 214 through the transceiver 204, such as an engine, a transmission, a navigation system, a steering system, and a braking system. The AVS 108 and the CAVS 110 may receive information from the vehicle systems 214 that is indicative of present operating conditions of the vehicle 104, such as vehicle speed, engine speed, turn signal status, brake position, vehicle position, steering angle, and ambient temperature. The AVS 108 and the CAVS 110 may also control one or more of the vehicle systems 214 based on the sensor data 212, for example, the AVS 108 and the CAVS 110 may control a braking system and a steering system to avoid an obstacle. The AVS 108 and the CAVS 110 may communicate directly with the vehicle systems 214 or communicate indirectly with the vehicle systems 214 over a vehicle communication bus, such as a CAN bus 216.

The SDS 102 may also communicate with external objects 218, such as remote vehicles and structures, to collect and share the external environment information. The SDS 102 may include a vehicle-to-everything (V2X) transceiver 220 that is connected to the AVS 108 for communicating with the objects 218. For example, the SDS 102 may use the V2X transceiver 220 for communicating directly with: a remote vehicle by vehicle-to-vehicle (V2V) communication, a structure (e.g., a sign, a building, or a traffic light) by vehicle-to-infrastructure (V2I) communication, and a motorcycle by vehicle-to-motorcycle (V2M) communication. Each V2X device may provide information indicative of its own status, and/or the status of another V2X device.

The SDS 102 may communicate with a remote computing device 222 over a communications network 224 using one or more of the transceivers 204, 220. For example, the SDS 102 may provide data to the remote computing device 222 that is indicative of a message or visual that indicates the location of the objects 218 relative to the vehicle 104, based on the sensor data 212. The remote computing device 222 may include one or more servers to process one or more processes of the technology described herein. The remote computing device 222 may also communicate data with a database 226 over the network 224.

The SDS 102 also communicates with a user interface 228 to provide information to a user of the vehicle 104. The AVS 108 and the CAVS 110 may control the user interface 228 to provide a message or visual that indicates the location of the objects 218 relative to the vehicle 104, based on the sensor data 212.

The AVS 108 includes a processing unit, or processor 230, that may include any number of microprocessors, GPUs, ASICs, ICs, memory (e.g., FLASH, ROM, RAM, EPROM and/or EEPROM) and software code to co-act with one another to perform a series of operations. Such hardware and/or software may be grouped together in assemblies to perform certain functions. Any one or more of the controllers or devices described herein include computer executable instructions that may be compiled or interpreted from computer programs created using a variety of programming languages and/or technologies. The AVS 108 also includes memory 232, or non-transitory computer-readable storage medium, that is capable of executing instructions of a software program. The memory 232 may be, but is not limited to, an electronic storage device, a magnetic storage device, an optical storage device, an electromagnetic storage device, a semi-conductor storage device, or any suitable combination thereof. In general, the processor 230 receives instructions, for example from the memory 232, a computer-readable medium, or the like, and executes the instructions. The AVS 108 also includes predetermined data, or "look up tables" that is stored within memory, according to aspects of the disclosure.

Although the AVS 108 is described as a single controller, it may contain multiple controllers, or may be embodied as software code within one or more other controllers. The AVS 108 and the CAVS 110 may communicate with each other over a private communication interface 234, which may be a Controller Area Network Flexible Data-Rate (CAN-FD) two-wire interconnection. In other embodiments, the private communication interface 234 includes wireless communication. The CAVS 110 includes architecture like that of the AVS 108, including a processor 236 and memory 238.

Figure 3:
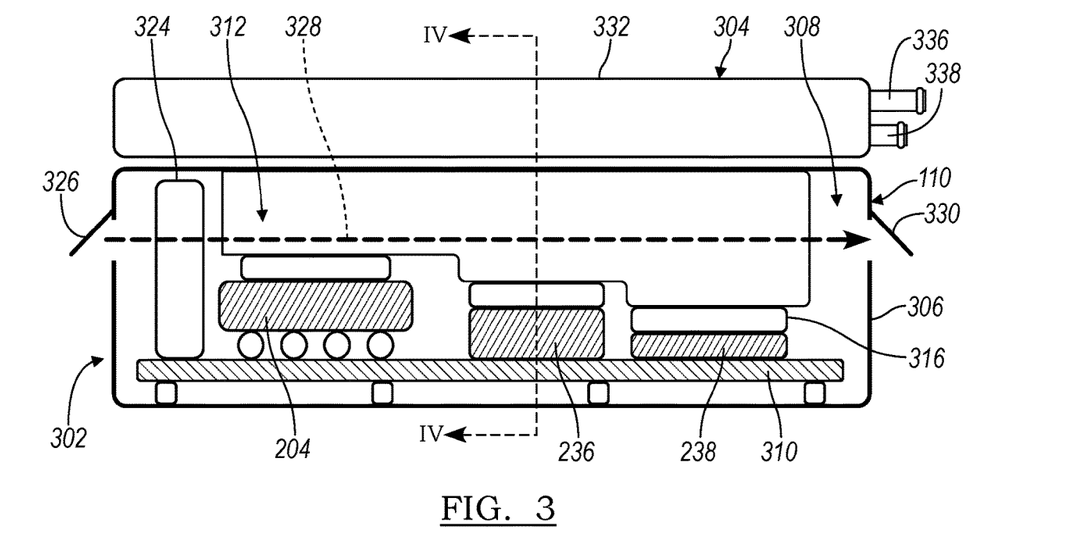
FIG. 3 is a side section view of an electronic control module of the SDS of FIG. 2, illustrated with the cooling system in accordance with aspects of the disclosure.

With reference to FIG. 3, the cooling system 100 includes an internal cooling subsystem 302 and an external cooling subsystem 304 to cool the CAVS 110. The CAVS 110 includes a chassis 306 that defines a cavity 308. The CAVS 110 also includes a circuit board assembly 310 that is mounted to the chassis 306 within the cavity 308. The circuit board assembly 310 includes electronics, such as the processor 236 and the memory 238, that generate heat during operation. The circuit board assembly 310 may also include a transceiver, such as the transceiver 204, for communicating with other systems and devices.

Figure 4:
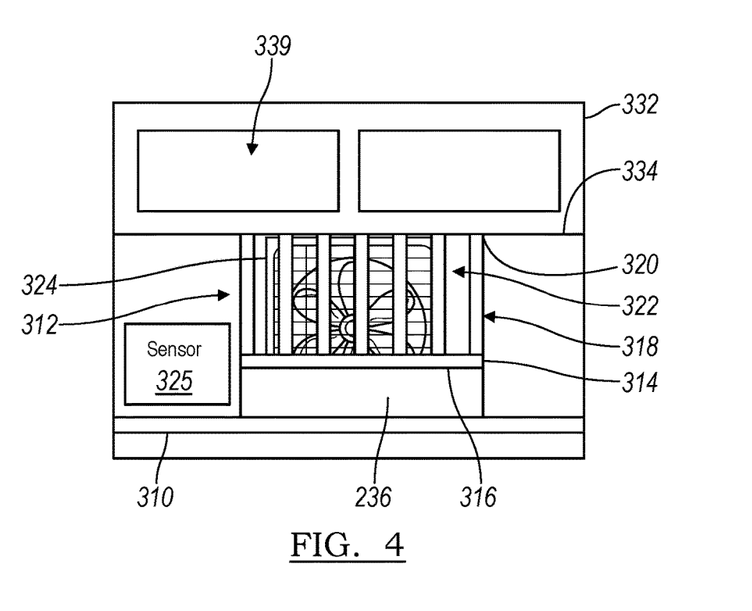
FIG. 4 is a section view of the electronic control module and cooling system of FIG. 3 taken along section line IV-IV, in accordance with aspects of the disclosure.

Referring to FIGS. 3 and 4, the CAVS 110 includes a heat sink 312 to transfer heat from the circuit board assembly 310. The heat sink 312 includes a base 314 that is coupled to the electronics of the circuit board assembly 310. The CAVS 110 may also include a thermal adhesive or thermal paste 316 between the base 314 and the circuit board assembly 310 to fill in any air gaps. The heat sink 312 includes a plurality of fins 318 extending away from the base 314 to engage an inner surface 320 of the chassis 306. The heat sink 312 is formed of a thermally conductive material, such as aluminum or copper, to transfer heat from the circuit board assembly 310 to the chassis 306. The fins 318 are spaced apart from each other to form channels 322. Although the heat sink 312 is described as a single component, the CAVS 110 may include multiple heat sinks 312, according to aspects of the disclosure.

Figure 5:
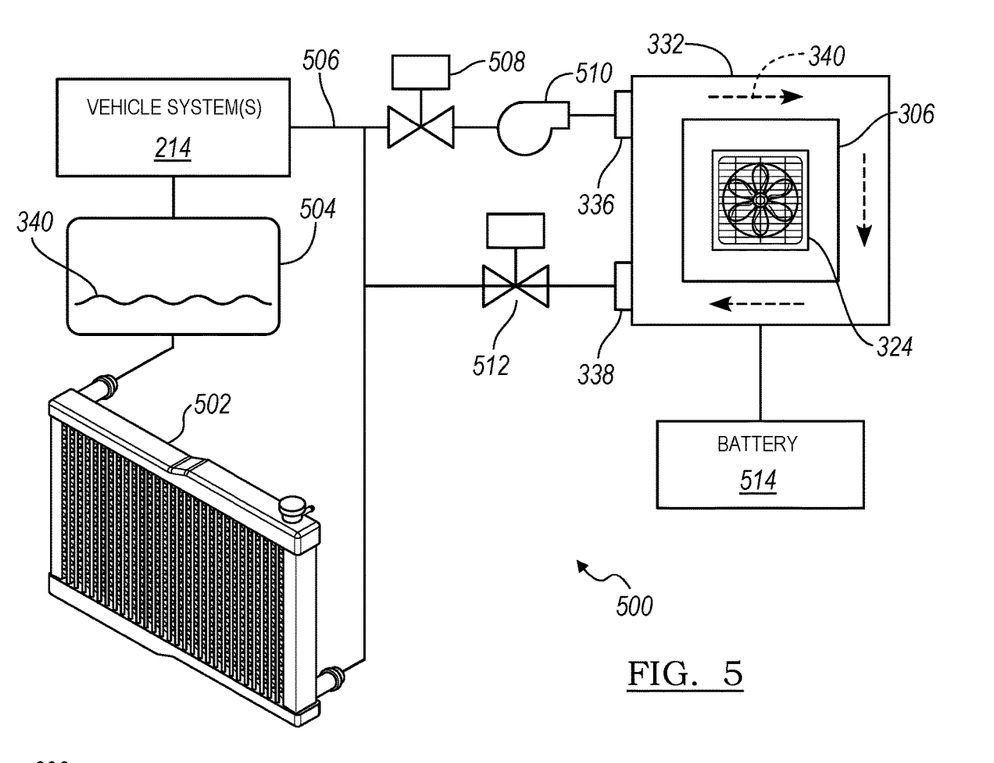
FIG. 5 is an exemplary architecture of the cooling system, in accordance with aspects of the disclosure.

The internal cooling subsystem 302 includes a fan 324 that is mounted within the cavity 308. The fan 324 may be an electric fan that is controlled by the processor 236 to direct air through the channels 322 of the heat sink 312. The fan 324 may be a direct current (DC) fan that receives electrical power from a vehicle battery 514, as shown in FIG. 5. The fan 324 may be controlled by the processor 236 in response to one or more input signals from a sensor, such as a temperature sensor 325 mounted to the circuit board assembly 310. The chassis 306 may include vents to facilitate air circulation. For example, the chassis 306 may include an air inlet vent 326, through which the fan 324 draws air 328 into the cavity 308. The fan 324 circulates air through the channels 322 of the heat sink 312 to absorb heat, and out of the cavity 308 through an air outlet vent 330. Although the heat sink 312 is described as having fins 318 that are spaced apart, the heat sink 312 may be formed in other shapes that include openings to permit air flow through the cavity 308, according to aspects of the disclosure.

The external cooling subsystem 304 includes a cold plate 332 that is mounted to an external surface 334 of the chassis 306, and proximate to the location of inner surface 320 at which the heat sink 312 engages. Heat from the circuit board assembly 310 transfers to the chassis 306 through the heat sink 312. The cold plate 332 includes an inlet 336 and an outlet 338. The cold plate 332 forms a manifold 339 for liquid 340 to flow through between the inlet 336 and the outlet 338 to transfer heat from the chassis 306 to the liquid 340.

Although the cold plate 332 is illustrated mounted to a top external surface 334 of the chassis 306 in FIG. 3, the cold plate 332 may extend over multiple surfaces of the chassis 306, according to aspects of the disclosure. The external cooling subsystem 304 may include an electric cooling system (not shown) in addition to, or as an alternative to the cold plate 332. The cooling system 100 may be provided with the internal cooling subsystem 302, and without the external cooling subsystem 304, for certain applications, such as lower temperature applications. The cooling system 100 may also be implemented in the AVS 108, according to aspects of the disclosure.

With reference to FIG. 5, the external cooling subsystem 304 may be coupled to a vehicle cooling system 500 for receiving the liquid 340. The vehicle cooling system 500 includes a radiator 502 for cooling the liquid 340, and a reservoir 504 for storing the liquid 340. The vehicle cooling system 500 supplies the liquid 340 to one or more of the vehicle system(s) 214, such as the engine or transmission, to cool the vehicle system 214.

The external cooling subsystem 304 is connected to a fluid line 506 of the vehicle cooling system 500 by an actuator 508. The actuator 508 includes a valve that may be controlled to open to supply the liquid 340. The external cooling subsystem 304 may also include a pump 510 to increase the pressure of the liquid 340 supplied to the inlet 336 of the chassis 306. The liquid 340 flows through the cold plate 332 to the outlet 338 while absorbing heat from the chassis 306. The external cooling subsystem 304 may include another actuator 512 that may be controlled to open to return the liquid 340 to the vehicle cooling system 500. The liquid may be a variety of known substances that can transfer heat, such as water, radiator fluid, and glycol.

The fan 324 of the internal cooling subsystem 302 is connected to a vehicle battery 514 to receive electrical power. The external cooling subsystem 304 may also include an electrical cooling element (not shown) that is connected to the vehicle battery 514.

Figure 6:
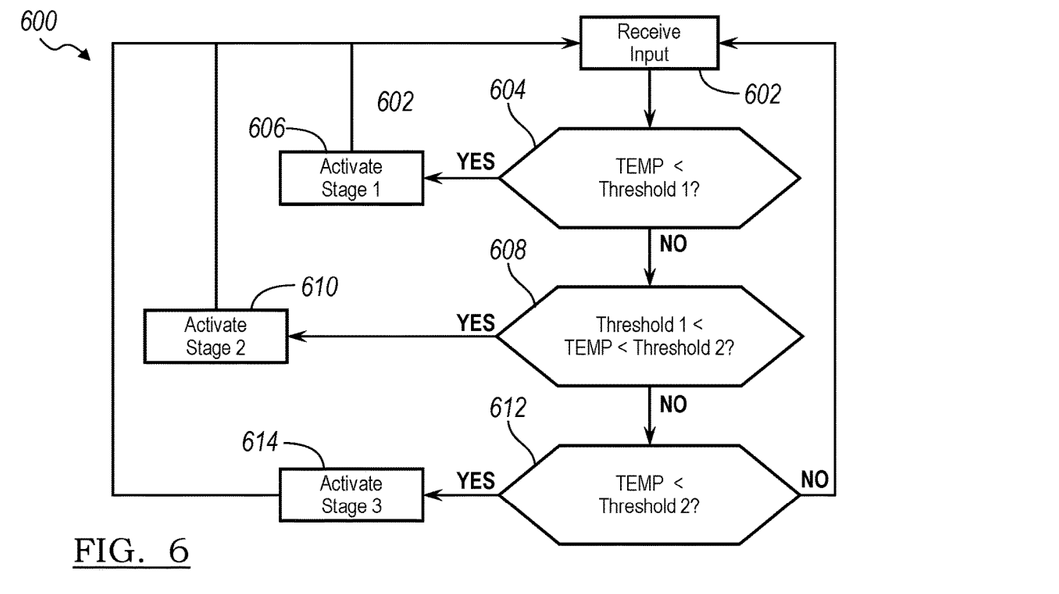
FIG. 6 is a flow chart illustrating a method for controlling the cooling system, in accordance with aspects of the disclosure.

With reference to FIG. 6, a flow chart depicting a method for controlling the cooling system 100 is illustrated in accordance with one or more embodiments and is generally referenced by numeral 600. The method 600 is implemented using software code that is executed by the processor 236 and contained within the memory 238 of the CAVS 110 according to aspects of the disclosure. Alternatively, the method 600, or portions of the method 600, may be implemented in one or more other processors, such as the processor 230 of the AVS 108. While the flowchart is illustrated with a number of sequential steps, one or more steps may be omitted and/or executed in another manner without deviating from the scope and contemplation of the present disclosure.

At step 602 the processor 236 receives input that is indicative of the temperature of the circuit board assembly 310. For example, the processor 236 may receive a temperature signal (TEMP) from the temperature sensor 325.

At step 604 the processor 236 analyzes the temperature signal to determine if the temperature is cool, i.e., if TEMP is less than a first temperature threshold (Threshold 1). If the temperature is less than the first temperature threshold, the processor 236 activates the first cooling stage at step 606 by turning on the fan 324 of the internal cooling subsystem 302 to circulate the air 328 through the chassis 306.

At step 608 the processor 236 analyzes the temperature signal to determine if the temperature is warm, i.e., if TEMP is greater than the first temperature threshold, but less than a second temperature threshold (Threshold 2). If the temperature is within this range, the processor 236 deactivates the first cooling stage by turning off the fan 324; and activates the second cooling stage at step 610 by controlling the actuators 508, 512 to open the valves and by activating the pump 510 to circulate the liquid 340 through the cold plate 332 of the external cooling subsystem 304.

At step 612, the processor 236 analyzes the temperature signal to determine if the temperature is hot, i.e., if TEMP is greater than the second temperature threshold (Threshold 2). If the temperature is greater than the second temperature threshold, the processor 236 activates the first cooling stage and the second cooling stage at step 614. The first temperature threshold may be between 50-70 degrees C. and the second temperature threshold may be between 80-100 degrees C., according to aspects of the disclosure. In one embodiment the first temperature threshold is 60 degrees C. and the second temperature threshold is 90 degrees C.

Figure 7:
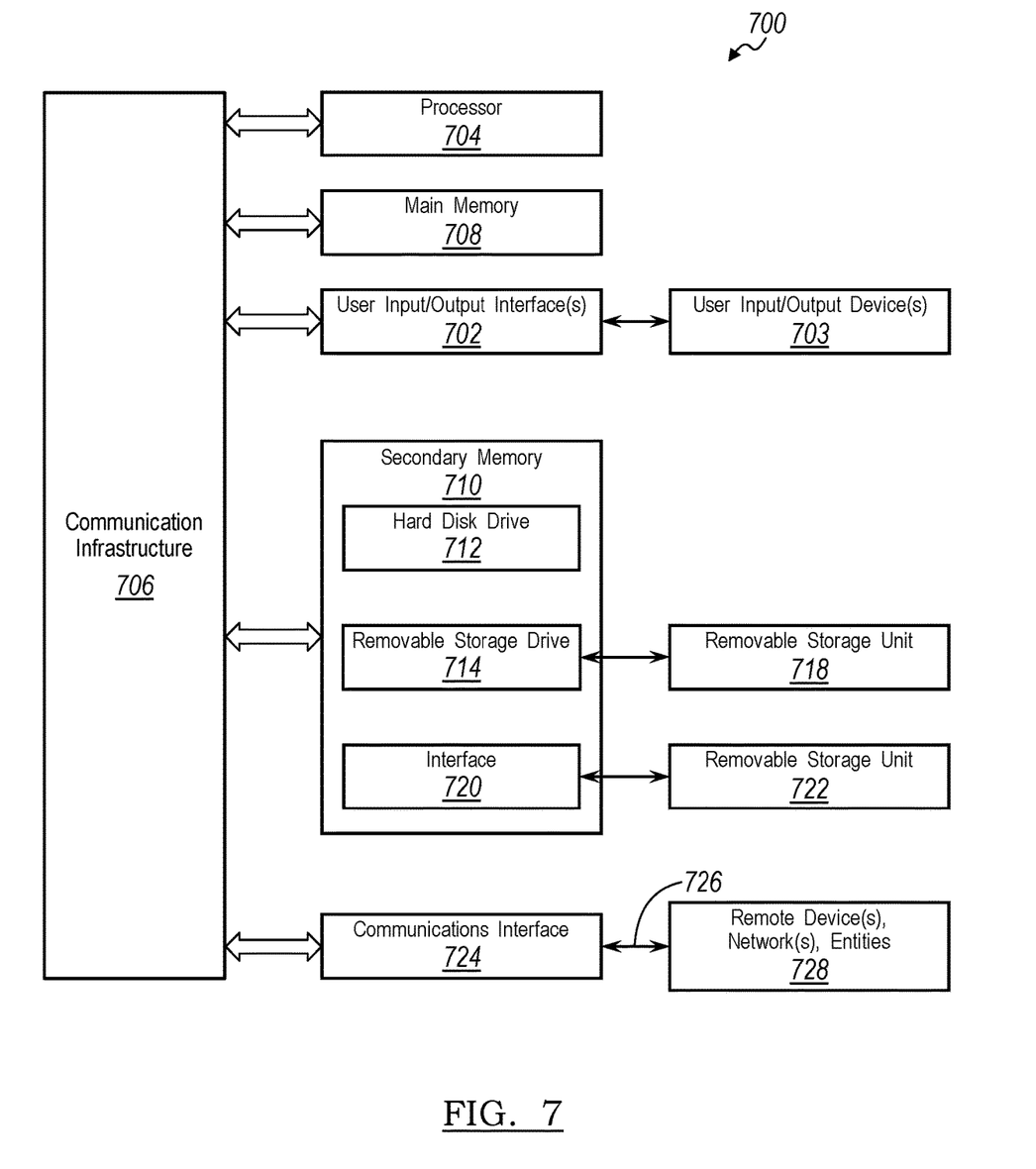
FIG. 7 is a detailed schematic diagram of an example computer system for implementing various embodiments, in accordance with aspects of the disclosure.

The cooling system 100 may include one or more controllers, such as the computer system 700 shown in FIG. 7. The computer system 700 may be any computer capable of performing the functions described herein. The computer system 700 also includes user input/output interface(s) 702 and user input/output device(s) 703, such as buttons, monitors, keyboards, pointing devices, etc.

The computer system 700 includes one or more processors (also called central processing units, or CPUs), such as a processor 704. The processor 704 is connected to a communication infrastructure or bus 706. The processor 704 may be a graphics processing unit (GPU), e.g., a specialized electronic circuit designed to process mathematically intensive applications, with a parallel structure for parallel processing large blocks of data, such as mathematically intensive data common to computer graphics applications, images, videos, etc.

The computer system 700 also includes a main memory 708, such as random-access memory (RAM), that includes one or more levels of cache and stored control logic (i.e., computer software) and/or data. The computer system 700 may also include one or more secondary storage devices or secondary memory 710, e.g., a hard disk drive 712; and/or a removable storage device 714 that may interact with a removable storage unit 718. The removable storage device 714 and the removable storage unit 718 may be a floppy disk drive, a magnetic tape drive, a compact disk drive, an optical storage device, tape backup device, and/or any other storage device/drive.

The secondary memory 710 may include other means, instrumentalities or other approaches for allowing computer programs and/or other instructions and/or data to be accessed by computer system 700, e.g., an interface 720 and a removable storage unit 722, e.g., a program cartridge and cartridge interface (such as that found in video game devices), a removable memory chip (such as an EPROM or PROM) and associated socket, a memory stick and USB port, a memory card and associated memory card slot, and/or any other removable storage unit and associated interface.

The computer system 700 may further include a network or communication interface 724 to communicate and interact with any combination of remote devices, remote networks, remote entities, etc. (individually and collectively referenced by reference number 728). For example, the communication interface 724 may allow the computer system 700 to communicate with remote devices 728 over a communication path 726, which may be wired and/or wireless, and which may include any combination of LANs, WANs, the Internet, etc. The control logic and/or data may be transmitted to and from computer system 700 via communication path 726.

In an embodiment, a tangible, non-transitory apparatus or article of manufacture comprising a tangible, non-transitory computer useable or readable medium having control logic (software) stored thereon is also referred to herein as a computer program product or program storage device. This includes, but is not limited to, the computer system 700, the main memory 708, the secondary memory 710, and the removable storage units 718 and 722, as well as tangible articles of manufacture embodying any combination of the foregoing. Such control logic, when executed by one or more data processing devices (such as the computer system 700), causes such data processing devices to operate as described herein.

The term "vehicle" refers to any moving form of conveyance that is capable of carrying either one or more human occupants and/or cargo and is powered by any form of energy. The term "vehicle" includes, but is not limited to, cars, trucks, vans, trains, autonomous vehicles, aircraft, aerial drones and the like. A "self-driving vehicle" or "autonomous vehicle" is a vehicle having a processor, programming instructions and drivetrain components that are controllable by the processor without requiring a human operator. An autonomous vehicle may be fully autonomous in that it does not require a human operator for most or all driving conditions and functions, or it may be semi-autonomous in that a human operator may be required in certain conditions or for certain operations, or that a human operator may override the vehicle's autonomous system and may take control of the vehicle. Notably, the present solution is being described herein in the context of an autonomous vehicle. However, the present solution is not limited to autonomous vehicle applications. The present solution may be used in other applications such as an advanced driver assistance system (ADAS), robotic applications, radar system applications, metric applications, and/or system performance applications.

Based on the teachings contained in this disclosure, it will be apparent to persons skilled in the relevant art(s) how to make and use embodiments of this disclosure using data processing devices, computer systems and/or computer architectures other than that shown in FIG. 7. In particular, embodiments can operate with software, hardware, and/or operating system implementations other than those described herein.

It is to be appreciated that the Detailed Description section, and not any other section, is intended to be used to interpret the claims. Other sections can set forth one or more but not all exemplary embodiments as contemplated by the inventor(s), and thus, are not intended to limit this disclosure or the appended claims in any way.

While this disclosure describes exemplary embodiments for exemplary fields and applications, it should be understood that the disclosure is not limited thereto. Other embodiments and modifications thereto are possible, and are within the scope and spirit of this disclosure. For example, and without limiting the generality of this paragraph, embodiments are not limited to the software, hardware, firmware, and/or entities illustrated in the figures and/or described herein. Further, embodiments (whether or not explicitly described herein) have significant utility to fields and applications beyond the examples described herein.

Embodiments have been described herein with the aid of functional building blocks illustrating the implementation of specified functions and relationships thereof. The boundaries of these functional building blocks have been arbitrarily defined herein for the convenience of the description. Alternate boundaries can be defined as long as the specified functions and relationships (or equivalents thereof) are appropriately performed. Also, alternative embodiments can perform functional blocks, steps, operations, methods, etc. using orderings different than those described herein.

References herein to "aspects," "one embodiment," "an embodiment," "an example embodiment," or similar phrases, indicate that the embodiment described can include a particular feature, structure, or characteristic, but every embodiment can not necessarily include the particular feature, structure, or characteristic. Moreover, such phrases are not necessarily referring to the same embodiment. Further, when a particular feature, structure, or characteristic is described in connection with an embodiment, it would be within the knowledge of persons skilled in the relevant art(s) to incorporate such feature, structure, or characteristic into other embodiments whether or not explicitly mentioned or described herein. Additionally, some embodiments can be described using the expression "coupled" and "connected" along with their derivatives. These terms are not necessarily intended as synonyms for each other. For example, some embodiments can be described using the terms "connected" and/or "coupled" to indicate that two or more elements are in direct physical or electrical contact with each other. The term "coupled," however, can also mean that two or more elements are not in direct contact with each other, but yet still co-operate or interact with each other. The breadth and scope of this disclosure should not be limited by any of the above-described exemplary embodiments, but should be defined only in accordance with the following claims and their equivalents.

While exemplary embodiments are described above, it is not intended that these embodiments describe all possible forms of the disclosure. Rather, the words used in the specification are words of description rather than limitation, and it is understood that various changes may be made without departing from the spirit and scope of the disclosure. Additionally, the features of various implementing embodiments may be combined to form further embodiments.

What is claimed is:

1. A cooling system comprising:
    a chassis defining a cavity;
    a circuit board assembly disposed in the cavity, the circuit board assembly comprising electronics that generate heat during operation;
    a heat sink coupled to the electronics and configured to engage an inner surface of the chassis;
    a fan mounted within the cavity and configured to direct air across the heat sink;
    and an external cooling subsystem mounted to at least one external surface of the chassis, wherein the external cooling subsystem is in thermal communication with the circuit board assembly through the heat sink for transferring heat generated by the electronics; and
    a processor configured to activate the fan and deactivate the external cooling subsystem in response to a temperature of the circuit board assembly being less than a first temperature threshold, and
    activate the external cooling subsystem and deactivate the fan from an active state in response to the temperature of the circuit board assembly increasing from below the first temperature threshold to exceeding the first temperature threshold and being less than a second temperature threshold, wherein the second temperature threshold is greater than the first temperature threshold.

2. The cooling system of claim 1, wherein the external cooling subsystem comprises:
    a cold plate defining a manifold, the cold plate being mounted to at least one external surface of the chassis; and
    at least one actuator configured to control flow of a liquid through the manifold.

3. The cooling system of claim 1, wherein the external cooling subsystem comprises an electric cooling element.

4. The cooling system of claim 1, wherein the heat sink further comprises:
    a base coupled to the electronics of the circuit board assembly; and
    at least two fins extending away from the base to engage the inner surface of the chassis, wherein the at least two fins are spaced apart from each other to form a channel;
    wherein the fan is further configured to direct the air through the channel.

5. The cooling system of claim 4, wherein the chassis comprises a sidewall with an inlet vent and an outlet vent formed through, and wherein the fan is further configured to draw air into the cavity through the inlet vent and direct air out of the cavity through the outlet vent.

6. The cooling system of claim 1, wherein the processor is further configured to activate the external cooling subsystem and the fan in response to the temperature of the circuit board assembly exceeding the second temperature threshold.

7. A vehicle system comprising:
an optical sensor configured to monitor an environment external to a vehicle;
the cooling system according to claim 1; and
wherein the processor is further configured to control at least one of a steering system and a braking system based on data from the optical sensor.

8. A vehicle system comprising:
an optical sensor configured to monitor an environment external to a vehicle;
a chassis defining a cavity;
a circuit board assembly disposed in the cavity, the circuit board assembly comprising electronics in communication with the optical sensor that generate heat during operation;
a fan mounted within the cavity and configured to direct air through the chassis;
an external cooling subsystem mounted to at least one external surface of the chassis, wherein the external cooling subsystem is in thermal communication with the circuit board assembly; and
a processor configured to activate the fan and deactivate the external cooling subsystem in response to a temperature of the circuit board assembly being less than a first temperature threshold, and
activate the external cooling subsystem and deactivate the fan from an active state in response to the temperature of the circuit board assembly exceeding the first temperature threshold and being less than a second temperature threshold, wherein the second temperature threshold is greater than the first temperature threshold.

9. The vehicle system of claim 8, wherein the external cooling subsystem comprises:
a manifold mounted to at least one external surface of the chassis; and
at least one actuator to enable and disable fluid communication of a liquid through the manifold.

10. The vehicle system of claim 8, wherein the external cooling subsystem comprises an electric cooling element.

11. The vehicle system of claim 8, further comprising a heat sink, the heat sink comprising:
a base coupled to the circuit board assembly; and
at least two fins extending away from the base to engage an inner surface of the chassis, wherein the at least two fins are spaced apart from each other to form a channel;
wherein the fan is further configured to direct the air through the channel.

12. The vehicle system of claim 8, wherein the processor is further configured to activate the external cooling subsystem and the fan in response to the temperature of the circuit board assembly exceeding the second temperature threshold.

13. A computer implemented method for controlling a cooling system comprising:
operating electronics of a circuit board assembly disposed within a chassis, thereby generating heat;
activating a fan to direct air through the chassis to transfer the heat from the circuit board assembly; and
activating an external cooling subsystem mounted to an external surface of the chassis to transfer the heat from the circuit board assembly;
activating the fan and deactivate the external cooling subsystem in response to a temperature of the circuit board assembly being less than a first temperature threshold; and
activating the external cooling subsystem and deactivating the fan from an active state in response to the temperature of the circuit board assembly exceeding the first temperature threshold and being less than a second temperature threshold, wherein the second temperature threshold is greater than the first temperature threshold.

14. The method of claim 13 further comprising:
activating the external cooling subsystem and the fan in response to the temperature of the circuit board assembly exceeding the second temperature threshold.

* * * * *